(12) United States Patent
Tsai et al.

(10) Patent No.: US 10,505,110 B2
(45) Date of Patent: Dec. 10, 2019

(54) PHASE CHANGE MEMORY STRUCTURE TO REDUCE POWER CONSUMPTION

(71) Applicant: Taiwan Semiconductor Manufacturing Co., Ltd., Hsin-Chu (TW)

(72) Inventors: Yi Jen Tsai, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/007,098

(22) Filed: Jun. 13, 2018

(65) Prior Publication Data

US 2019/0067572 A1 Feb. 28, 2019

Related U.S. Application Data

(60) Provisional application No. 62/550,754, filed on Aug. 28, 2017.

(51) Int. Cl.
*H01L 45/00* (2006.01)
*H01L 27/24* (2006.01)

(52) U.S. Cl.
CPC .......... *H01L 45/1286* (2013.01); *H01L 45/06* (2013.01); *H01L 45/126* (2013.01); *H01L 45/1233* (2013.01); *H01L 45/1253* (2013.01); *H01L 45/1293* (2013.01); *H01L 45/144* (2013.01); *H01L 45/16* (2013.01); *H01L 45/1683* (2013.01); *H01L 27/2436* (2013.01); *H01L 27/2463* (2013.01)

(58) Field of Classification Search
None
See application file for complete search history.

(56) References Cited

U.S. PATENT DOCUMENTS

| 6,815,704 | B1 | 11/2004 | Chen |
| 2005/0111247 | A1 | 5/2005 | Takaura et al. |
| 2008/0265238 | A1* | 10/2008 | Chen ................. H01L 45/06 257/3 |

(Continued)

OTHER PUBLICATIONS

Park, et al. "Plasma Charging Damage on Ultrathin Gate Oxides." IEEE Electron Device Letters, vol. 19, No. 1, Jan. 1998.

(Continued)

*Primary Examiner* — J. E. Schoenholtz
(74) *Attorney, Agent, or Firm* — Eschweiler & Potashnik, LLC (57) ABSTRACT

A phase change memory (PCM) cell with enhanced thermal isolation and low power consumption is provided. In some embodiments, the PCM cell comprises a bottom electrode, a dielectric layer, a heating element, and a phase change element. The dielectric layer is on the bottom electrode. The heating element extends through the dielectric layer, from a top of the dielectric layer to the bottom electrode. Further, the heating element has a pair of opposite sidewalls laterally spaced from the dielectric layer by a cavity. The phase change element overlies and contacts the heating element. An interface between the phase change element and the heating element extends continuously respectively from and to the opposite sidewalls of the heating element. Also provided is a method for manufacturing the PCM cell.

20 Claims, 9 Drawing Sheets

(56) References Cited

U.S. PATENT DOCUMENTS

| | | | |
|---|---|---|---|
| 2008/0277642 A1 | 11/2008 | In T Zandt et al. | |
| 2008/0304310 A1 | 12/2008 | Philipp et al. | |
| 2009/0191367 A1* | 7/2009 | Chen | B82Y 10/00 428/34.1 |
| 2011/0266511 A1 | 11/2011 | Shen et al. | |
| 2012/0056148 A1* | 3/2012 | Kakegawa | H01L 27/2463 257/4 |
| 2016/0064656 A1* | 3/2016 | Lin | H01L 45/06 257/5 |

OTHER PUBLICATIONS

Chen, et al. "Dual-Gate AlGaN/GaN Modulation-Doped Field-Effect Transistors with Cut-Off Frequencies fT > 60 GHz." IEEE Electron Device Letters, vol. 21, No. 12, Dec. 2000.

Lasance, Clemens. "The Thermal Conductivity of Silicon Dioxide." Design, Materials, Compounds, Adhesives, Substrates, No. 3, Semiconductor, Technical Data, Test & Measurement, vol. 10, Aug. 1, 2004.

Engineering ToolBox, "Thermal Conductivity of Common Materials and Gases." Published in 2003. Available at: https://www.engineeringtoolbox.com/thermal-conductivity-d_429.html.

Chen, et al. "Emerging Nanoelectronic Devices." Published by John Wiley and Sons Ltd. 1st Published in 2005. ISBN No. ISBN 978-1-118-44774-1.

Shrestha, Sampurna. "PCRAM—Phase Change Memory." Computersciencementor | Hardware, Software, Networking and Programming. Published on Mar. 1, 2017. Retrieved online at https://computersciencementor.com/pcram/.

\* cited by examiner

PHASE CHANGE MEMORY STRUCTURE TO REDUCE POWER CONSUMPTION

REFERENCE TO RELATED APPLICATION

This Application claims priority to U.S. Provisional Application No. 62/550,754 filed on Aug. 28, 2017, the contents of which are hereby incorporated by reference in their entirety.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCE is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a bottom electrode and a top electrode, and as well as a dielectric layer, a heating element, and a PCE (PCE). The dielectric layer and the PCE are stacked between the bottom and top electrodes, and the PCE is between the dielectric layer and the top electrode. Further, the heating element extends from the PCE, through the dielectric layer, to the bottom electrode. The PCE comprises an active PCE region adjoining the heating element and having a variable phase representing a bit of data. In operation, the heating element heats the active PCE region to change the active PCE region between an amorphous phase and a crystalline phase.

Changing the active PCE region to the crystalline phase (e.g., programming the PCM cell) has low power consumption since crystallization of the active PCE region may be performed at a low temperature (e.g., about 100-150 degrees Celsius). However, changing the active PCE region to the amorphous phase (e.g., erasing the PCM cell) has high power consumption since such a change is brought about by melting the active PCE region at a high temperature (e.g., greater than about 600 degrees Celsius). The high power consumption is exacerbated by a majority of heat diffusing to structures other than the active PCE region (e.g., the dielectric layer and the bottom electrode). For example, about 21-25% of heat generated by the heating element may diffuse to the dielectric layer.

Various embodiments of the present application are directed towards a PCM cell with enhanced thermal isolation and low power consumption. In some embodiments, the PCM cell comprises a bottom electrode, a dielectric layer, a heating element, and a phase change element. The dielectric layer is on the bottom electrode. The heating element extends through the dielectric layer, from a top of the dielectric layer to the bottom electrode. Further, the heating element has a pair of opposite sidewalls laterally spaced from the dielectric layer by a cavity. The phase change element overlies and contacts the heating element. An interface between the phase change element and the heating element extends continuously respectively from and to the opposite sidewalls of the heating element.

The cavity thermally isolates the heating element from the dielectric layer. As such, a large amount (e.g., about 28-40%, about 30-50%, or about 40-50%) of heat generated by the heating element is applied to the active PCE region, instead of to the dielectric layer, whereby power consumption is low when changing between phases. Further, the cavity electrically isolates the heating element from the dielectric layer. As such, charge leaking from the heating element to the dielectric layer is low, and efficiency and reliability of the PCM cell are high.

Figure 1A:
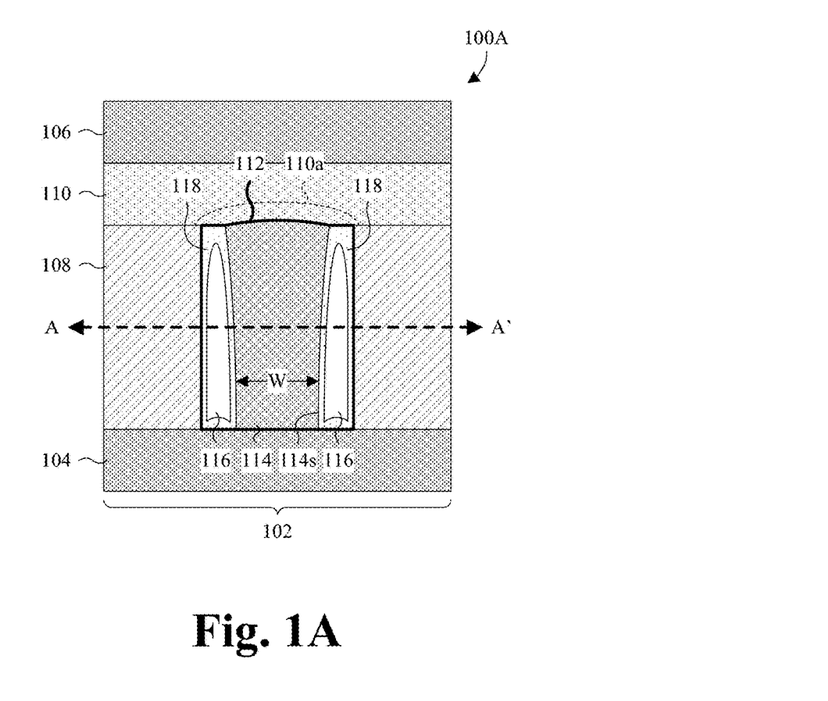
FIGS. 1A and 1B illustrate various views of some embodiments of a phase change memory (PCM) cell with enhanced thermal isolation and low power consumption.
Figure 1B:
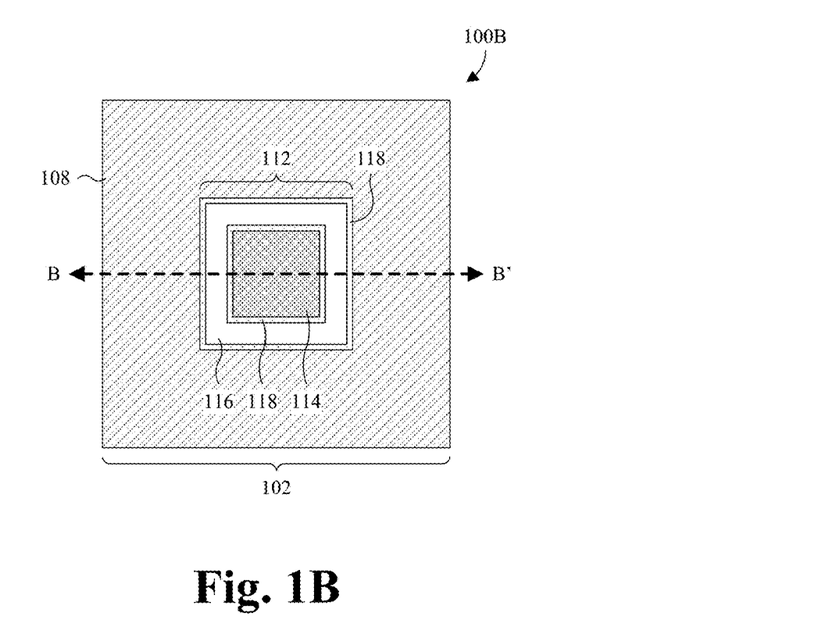

With reference to FIGS. 1A and 1B, various views 100A, 100B of some embodiments of a PCM cell 102 with enhanced thermal isolation and low power consumption is provided. FIG. 1A may, for example, be taken along line B-B' in FIG. 1B, and FIG. 1B may, for example, be taken along line A-A' in FIG. 1A.

As illustrated by the cross-sectional view 100A of FIG. 1A, the PCM cell 102 includes a bottom electrode 104 and a top electrode 106, as well as a heater dielectric layer 108, a PCE 110, and a heating plug 112. The bottom and top electrodes 104, 106 are conductive, and may be or otherwise include, for example, tungsten, copper, aluminum copper, aluminum, some other conductive material, or a combination of the foregoing. Further, the bottom and top electrodes 104, 106 may be, for example, vias and/or metal wires.

The heater dielectric layer 108 and the PCE 110 are stacked between the bottom and top electrodes 104, 106, and the PCE 110 is between the heater dielectric layer 108 and the top electrode 106. In some embodiments, the heater dielectric layer 108 is or otherwise includes silicon dioxide, silicon nitride, or some other dielectric. Further, in some embodiments, the heater dielectric layer 108 is a single dielectric material.

The PCE 110 includes an active PCE region 110a extending upward into the PCE 110 from a bottom of the PCE 110. The active PCE region 110a has a variable phase representing a data bit. For example, a crystalline phase of the active PCE region 110a and an amorphous phase of the active PCE region 110a may respectively represent a binary "1" and a binary "0", or vice versa. Further, the active PCE region 110a has a variable resistance that changes with the variable phase of the active PCE region 110a. For example, the active PCE region 110a may have a high resistance in the amorphous phase and a low resistance in the crystalline phase. In some embodiments, a bulk of the PCM cell 102 adjoins the active PCE region 110a and has a fixed phase, such as, for example, an amorphous phase or a crystalline phase. The PCE 110, and hence the active PCE region 110a, may be or otherwise include, for example, $Ge_2Sb_2Te_5$ (GST), Ge—In—Sb—Te (GIST), Ag—In—Sb—Te (AIST), or some other chalcogenide compound.

The heating plug 112 is in the heater dielectric layer 108, under the PCE 110, and comprises a heating element 114, a cavity 116, and a cavity dielectric layer 118. The heating element 114 extends through the heater dielectric layer 108, from the bottom electrode 104 to the PCE 110, and interfaces with the active PCE region 110a. In some embodiments, the heating element 114 has a width W that increases continuously from the bottom electrode 104 to the PCE 110, and/or has sidewalls 114s arcing continuously from the bottom electrode 104 to the PCE 110. Further, the heating element 114 generates heat in proportion to the voltage and/or current applied across the heating element 114, and is configured to variably heat the active PCE region 110a to change the active PCE region 110a between phases. The heating element 114 may, for example, generate heat resistively, and/or may be, for example, titanium nitride, tungsten nitride, titanium carbide, or some other high resistance material.

The cavity 116 laterally surrounds the heating element 114, and is lined by the cavity dielectric layer 118. The cavity dielectric layer 118 may be or otherwise include silicon dioxide, silicon nitride, or some other dielectric. Further, the cavity 116 laterally spaces the heating element 114 from the heater dielectric layer 108 to provide thermal and electrical insulation between the heating element 114 and the heater dielectric layer 108. In some embodiments, the cavity 116 is hermetically sealed, and/or is filled with air, a nitride gas, or some other gas. Further, in some embodiments, the cavity 116 has a thermal conductivity less than that of the heater dielectric layer 108, and/or less than about 0.024 watts per square meter of surface area for a temperature gradient of one kelvin for every meter thickness (W/mK).

By thermally insulating the heating element 114 from the heater dielectric layer 108, the cavity 116 minimizes heat diffusing into the heater dielectric layer 108. As such, when changing the phase of the active PCE region 110a, a large amount (e.g., about 21-25%, about 28-40%, about 30-50%, or about 40-50%) of heat generated by the heating element 114 is applied to the active PCE region 110a, and power consumption by the PCM cell 102 is low. Further, by electrically insulating the heating element 114 from the heater dielectric layer 108, the cavity 116 minimizes charge leaking into the heater dielectric layer 108 other than the active PCE region 110a. As such, the efficiency and the reliability of the PCM cell 102 are high.

In operation of the PCM cell 102, the data state of the PCM cell 102 is read by measuring the resistance of the PCM cell 102 (i.e., the resistance from the bottom electrode 104 to the top electrode 106). The phase of the active PCE region 110a represents the data state of the PCM cell 102, and the resistance of the active PCE region 110a, and hence the resistance of the PCM cell 102, change with the phase of the active PCE region 110a. Further, the data state of the PCM cell 102 is programmed and erased by variably heating the active PCE region 110a to change the phase of the active PCE region 110a.

To change the active PCE region 110a to the crystalline phase (e.g., to program the PCM cell 102), the heating element 114 heats the active PCE region 110a to a first temperature that induces crystallization of the active PCE region 110a. To change the active PCE region 110a to the amorphous phase (e.g., to erase the PCM cell 102), the heating element 114 heats the active PCE region 110a to a second temperature that melts the active PCE region 110a. The second temperature exceeds the first temperature, such that power consumption is higher when changing the active PCE region 110a to the amorphous phase than when changing the active PCE region 110a to the crystalline phase. The first temperature may, for example, be between about 100-150 degrees Celsius, and/or the second temperature may, for example, be greater than about 600, 800, or 1000 degrees Celsius.

As illustrated by the top view 100B of FIG. 1B, the heating plug 112 may, for example, have a square, rectangular, triangular, or circular layout. Further, the cavity 116 may, for example, extend laterally to completely enclose the heating element 114, and/or may, for example, be square-ring shaped or circular-ring shaped.

Figure 2:
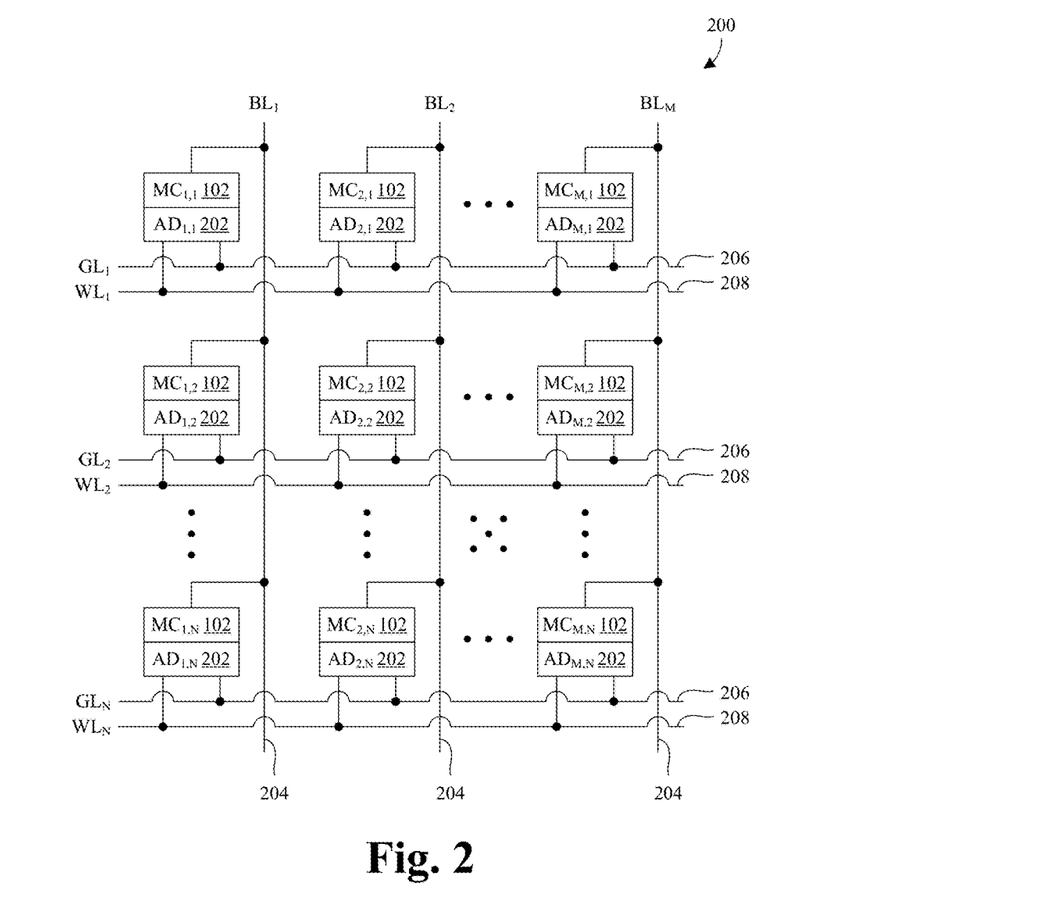
FIG. 2 illustrates a block diagram of some embodiments of a PCM cell array with enhanced thermal isolation and low power consumption.

With reference to FIG. 2, a block diagram 200 of some embodiments of a PCM cell array with enhanced thermal isolation and low power consumption is provided. As illustrated, the PCM cell array comprises a plurality of PCM cells 102 in M columns and N rows, where M and N are integers greater than zero. For clarity, the PCM cells 102 are individually labeled $MC_{<column>,<row>}$. The PCM cells 102 are located at the intersections of respective columns and respective rows, and are each as described in FIGS. 1A and 1B.

A plurality of access devices 202 correspond to the PCM cells 102, and selectively electrically couple the corresponding PCM cells 102 between a set of bit lines 204 and a set of ground lines 206 based on a set of word lines 208. For example, an access device may selectively electrically couple a corresponding bit line to a corresponding ground line through a corresponding PCM cell based on a corresponding word line. The correspondence between the PCM cells 102 and the access devices 202 may be, for example, one to one, and/or the access devices 202 may be, for example, insulated gate field-effect transistors (IGFETs). For clarity, the access devices 202 are individually labeled as $AD_{<column>,<row>}$.

The set of word lines 208 facilitate access to the PCM cells 102 on a row-by-row basis by gating the access devices 202, and includes a word line for each row. For clarity, the word lines 208 are individually labeled as $WL_{<row>}$. The set of bit lines 204 facilitate reading from and/or writing to accessed PCM memory cells on a column-by-column basis by selectively biasing the PCM cells 102, and includes a bit line for each column. For clarity, the bit lines 204 are individually labeled as $BL_{<column>}$. The set of ground lines 206 provide conductive paths to ground for the bit lines 204 on a row-by-row basis, and includes a ground line for each row. For clarity, the ground lines 206 are individually labeled as $GL_{<row>}$.

In operation of the PCM cell array, a row of PCM cells is accessed by activating a word line for the row. For example, word line $WL_1$ may be set to a logic "1" while the other word lines are set to a logic "0". This, in turn, electrically couples PCM cells of the row between a ground line for the row and respectively the bit lines 204 using corresponding access devices. For example, continuing with the above example, PCM cells $MC_{1,1}$, $MC_{2,1}$, and $MC_{M,1}$ may be electrically coupled between ground line $GL_1$ and respectively bit lines $BL_1$, $BL_2$, and $BL_M$ using access devices $AD_{1,1}$, $AD_{2,1}$, and $AD_{M,1}$. The PCM cells of the row may then be read from and/or written to by selectively biasing the bit lines 204.

Figure 3:
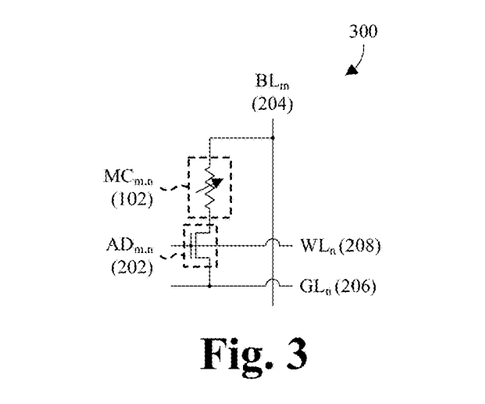
FIG. 3 illustrates a circuit diagram of some embodiments of the electrical coupling of a PCM cell between a bit line and a ground line in the PCM cell array of FIG. 2.

With reference to FIG. 3, a circuit diagram 300 of some embodiments of the electrical coupling of a PCM cell 102 between a bit line 204 and a ground line 206 in the PCM cell array of FIG. 2 is provided. The PCM cell 102 corresponds to PCM cell $MC_{m,n}$ at column m and row n in the PCM cell array of FIG. 2, where m and n are integers that are greater than zero and respectively less than or equal to M and N in FIG. 2. Further, the bit line 204 is bit line $BL_m$ at column m in the PCM cell array of FIG. 2, and the ground line 206 is ground line $GL_n$ at row n in the PCM cell array of FIG. 2.

As illustrated, a first terminal of the PCM cell 102 is electrically coupled to the bit line 204, and another terminal of the PCM cell 102 is electrically coupled to a first source/drain of an access device 202. The access device 202 corresponds to access device $AD_{m,n}$ at column m and row n in the PCM cell array of FIG. 2. Further, a second source/drain of the access device 202 is electrically coupled to the ground line 206, and a gate of the access device 202 is electrically coupled to a word line 208. The word line 208 is word line $WL_n$ at row n in the PCM cell array of FIG. 2.

While the PCM cells 102 are shown as being electrically coupled directly to the bit lines 204 in FIGS. 2 and 3, and the access devices 202 are shown as being electrically coupled directly to the ground lines 206 in FIGS. 2 and 3, such electrical coupling may be reversed in other embodiments. That is to say, in other embodiments, the PCM cells 102 may be electrically coupled directly to the ground lines 206 and the access devices 202 may be electrically coupled directly to the bit lines 204.

Figure 4A:
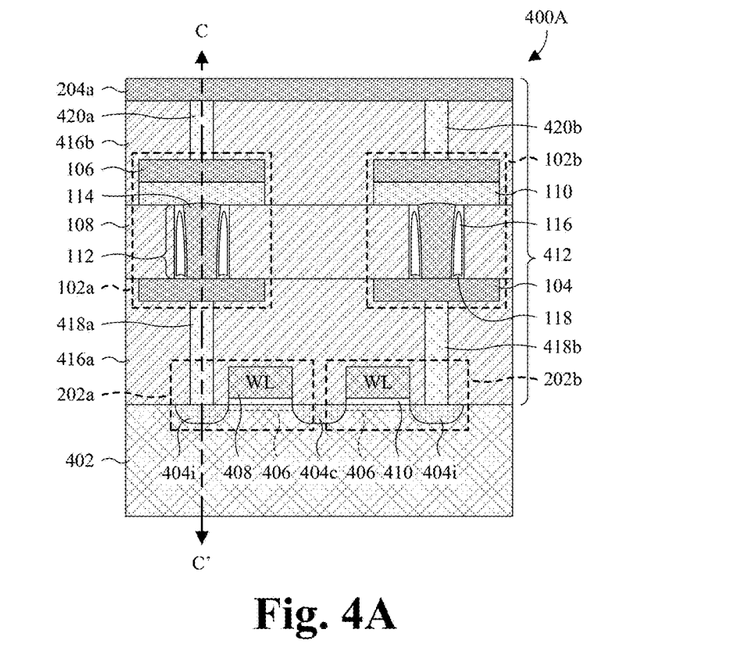
FIGS. 4A and 4B illustrate various cross-sectional views of some embodiments of an integrated circuit (IC) comprising a plurality of PCM cells with enhanced thermal isolation and reduced power consumption.
Figure 4B:
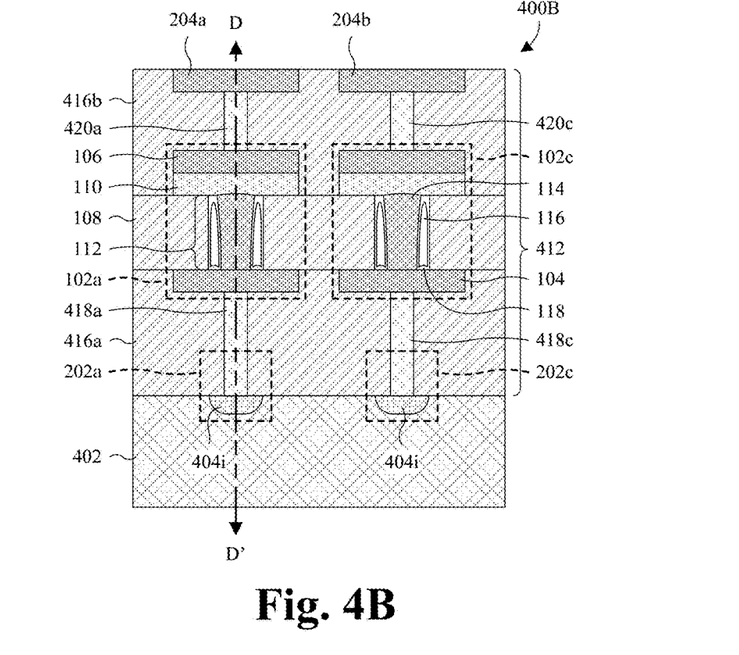

With reference to FIGS. 4A and 4B, various cross-sectional views 400A, 400B of some embodiments of an integrated circuit (IC) comprising a plurality of PCM cells with enhanced thermal isolation and reduced power consumption is provided. FIGS. 4A and 4B are orthogonal to one another. FIG. 4A illustrates a cross-sectional view 400A of the IC taken along line D-D' in FIG. 4B. FIG. 4B illustrates a cross-sectional view 400B of the IC taken along line C-C' in FIG. 4A.

As illustrated by the cross-sectional view 400A of FIG. 4A, a semiconductor substrate 402 supports a first access device 202a and a second access device 202b. The first and second access devices 202a, 202b may be, for example, IGFETs, and/or the semiconductor substrate 402 may be, for example, a bulk silicon substrate, a silicon-on-insulator (SOI) substrate, or some other type of semiconductor substrate.

The first and second access devices 202a, 202b share a common source/drain region 404c and have individual source/drain regions 404i. The individual source/drain regions 404i and the common source/drain region 404c are in the semiconductor substrate 402, along a top surface of the semiconductor substrate 402. Further, the individual source/drain regions 404i and the common source/drain region 404c define selectively-conductive channels 406 in the semiconductor substrate 402. The selectively-conductive channels 406 are individual to the first and second access devices 202a, 202b, and each extends from the common source/drain region 404c to a respective one of the individual source/drain regions 404i. In some embodiments, the common source/drain region 404c is a ground line (e.g., ground line $GL_1$ in FIG. 2).

The first and second access devices 202a, 202b each comprise a gate electrode 408 and a gate dielectric layer 410. For ease of illustration, only one of the gate electrodes 408 is labeled 408, and only one of the gate dielectric layers 410 is labeled 410. The gate electrode 408 and the gate dielectric layer 410 are stacked between the common source/drain region 404c and a respective one of the individual source/drain regions 404i. Further, the gate electrode 408 overlies the gate dielectric layer 410 and is conductive. The gate electrode 408 may be, for example, metal or doped polysilicon, and/or may be, for example, a word line (e.g., word line $WL_1$ in FIG. 2). The gate dielectric layer 410 may be, for example, oxide, a high κ dielectric, some other dielectric or a combination of the foregoing. As used herein, a high κ dielectric is a dielectric with a dielectric constant κ greater than about 3.9, 5, 10, 15, or 20.

A back-end-of-line (BEOL) interconnect structure 412 covers the semiconductor substrate 402 and the first and second access devices 202a, 202b, and comprises a plurality of dielectric layers stacked upon one another. The dielectric layers comprise a first interconnect dielectric layer 416a, a heater dielectric layer 108 overlying the first interconnect dielectric layer 416a, and a second interconnect dielectric layer 416b overlying the heater dielectric layer 108. The heater dielectric layer 108 may be, for example, oxide, nitride, some other dielectric layer, or a combination of the foregoing, and/or the first and second interconnect dielectric layers 416a, 416b may be, for example, oxide, nitride, a low κ dielectric, some other dielectric, or a combination of the foregoing. As used herein, a low κ dielectric is a dielectric with a dielectric constant κ less than about 3.9, 3, 2, or 1.

The BEOL interconnect structure 412 further comprises a plurality of conductive features stacked within the plurality of dielectric layers (e.g., the first interconnect dielectric layer 416a). The conductive features comprise a first PCM cell via 418a, a second PCM cell via 418b, a first bit line 204a, a first bit line via 420a, and a second bit line via 420b. The first and second PCM cell vias 418a, 418b extend respectively from the individual source/drain regions 404i respectively to a first PCM cell 102a and a second PCM cell 102b. The first and second bit line vias 420a, 420b extend respectively from the first and second PCM cells 102a, 102b to the first bit line 204a.

The first and second PCM cells 102a, 102b underlie the first bit line 204a, and respectively overlie the first and second access devices 202a, 202b. The first and second PCM cells 102a, 102b are each as the PCM cell 102 is described in FIGS. 1A and 1B. The first and second PCM cells 102a, 102b each comprise a bottom electrode 104, a top electrode 106, a PCE 110, and a heating plug 112. For ease of illustration, only one of the bottom electrodes 104 is labeled 104, only one of the top electrodes 106 is labeled 106, only one of the PCEs 110 is labeled 110, and only one of the heating plug 112 is labeled 112.

The bottom electrodes 104 overlie and are electrically coupled to the first and second PCM cell contact vias 418a, 418b, respectively. In some embodiments, the bottom electrodes 104 are pads, and/or square or rectangular shaped. The heater dielectric layer 108 overlies the bottom electrodes 104, and the heating plugs 112 extend through the heater dielectric layer 108 respectively to the bottom electrodes 104. The PCEs 110 overlie and are in thermal communication with the heating plugs 112, respectively. The top electrodes 106 overlie and are electrically coupled to the PCEs 110, respectively, and underlie and are electrically coupled to the first and second bit line vias 420a, 420b, respectively. In some embodiments, the top electrodes 106 are pads, and/or square or rectangular shaped. As used herein, a footprint of an object (e.g., a bottom electrode or a top electrode) is a two-dimensional (2D) projection of the object onto an underlying horizontal plane.

The heating plugs 112 each comprise a heating element 114, a cavity 116, and a cavity dielectric layer 118. For ease of illustration, only one of the heating elements 114 is labeled 114, only one of the cavities 116 is labeled 116, and only one of the cavity dielectric layers 118 is labeled 118. The heating elements 114 extend through the heater dielectric layer 108, and are configured to respectively heat the PCEs 110. The cavities 116 laterally surround respective ones of the heating elements 114, and are respectively lined by the cavity dielectric layers 118. The cavities 116 thermally and electrically insulates the heating elements 114 from the heater dielectric layer 108 for lower power consumption and improved efficiency and reliability.

As illustrated by the cross-sectional view 400B of FIG. 4B, the first access device 202a neighbors a third access device 202c. Although only partially shown, the third access device 202c is as the first and second access devices 202a, 202b are described with regard to FIG. 4A. Further, the first PCM cell via 418a and a third PCM cell via 418c extend respectively from individual source/drain regions 404i of the first and third access devices 202a, 202c respectively to the first PCM cell 102a and a third PCM cell 102c.

The first and third PCM cells 102a, 102c are each as the PCM cell 102 of FIGS. 1A and 1B is described, such that the first and third PCM cells 102a, 102c each comprise a bottom electrode 104, a top electrode 106, a PCE 110, and a heating plug 112. For ease of illustration, only one of the bottom electrodes 104 is labeled 104, only one of the top electrodes 106 is labeled 106, only one of the PCEs 110 is labeled 110, and only one of the heating plug 112 is labeled 112. Further, the first and third PCM cells 102a, 102c respectively underlie the first bit line 204a and a second bit line 204b, and are electrically coupled to the first and second bit lines 204a, 204b respectively by the first bit line via 420a and a third bit line via 420c.

With reference to FIGS. 5-14, a series of cross-sectional views 500-1400 of some embodiments of a method for manufacturing a PCM cell with enhanced thermal isolation and low power consumption is provided. The PCM cell may, for example, be the PCM cell 102 of FIGS. 1A and 1B.

Figure 5:
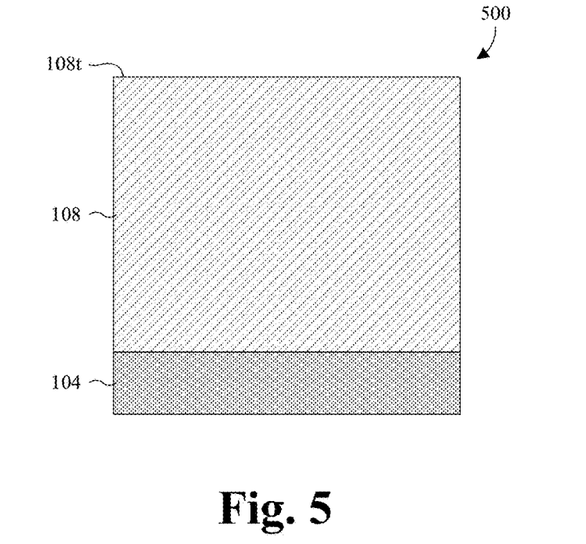
FIGS. 5-14 illustrate a series of cross-sectional views of some embodiments of a method for manufacturing a PCM cell with enhanced thermal isolation and low power consumption.

As illustrated by the cross-sectional view 500 of FIG. 5, a heater dielectric layer 108 is formed on a bottom electrode 104. In some embodiments, the heater dielectric layer 108 is formed with a top surface 108t that is planar. Further, in some embodiments, the heater dielectric layer 108 is formed of silicon dioxide, silicon nitride, some other dielectric, or a combination of the foregoing. For example, the heater dielectric layer 108 may be formed as a multi-layer film consisting of an oxide layer and a nitride layer overlying the oxide layer.

In some embodiments, a process for forming the heater dielectric layer 108 comprises depositing or growing the heater dielectric layer 108 on the bottom electrode 104, and subsequently performing a planarization into the top surface 108t of the heater dielectric layer 108. The heater dielectric layer 108 may, for example, be deposited or grown by, for example, thermal oxidation, vapor deposition, sputtering, or some other deposition process. Further, the planarization may, for example, be performed by a chemical mechanical polish (CMP).

Figure 6:
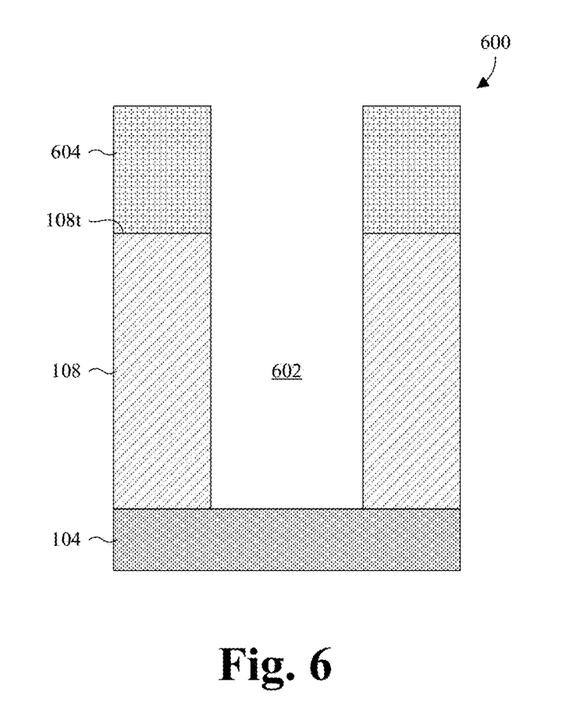

As illustrated by the cross-sectional view 600 of FIG. 6, a plug opening 602 exposing the bottom electrode 104 is formed in the heater dielectric layer 108. The plug opening 602 may, for example, have the same layout as the heating plug 112 in FIG. 1B. In some embodiments, a process for forming the plug opening 602 comprises performing an etch into the heater dielectric layer 108 while a patterned photoresist layer 604 selectively covers the heater dielectric layer 108, and subsequently stripping the patterned photoresist layer 604. The patterned photoresist layer 604 may, for example, be patterned using photolithography.

Figure 7:
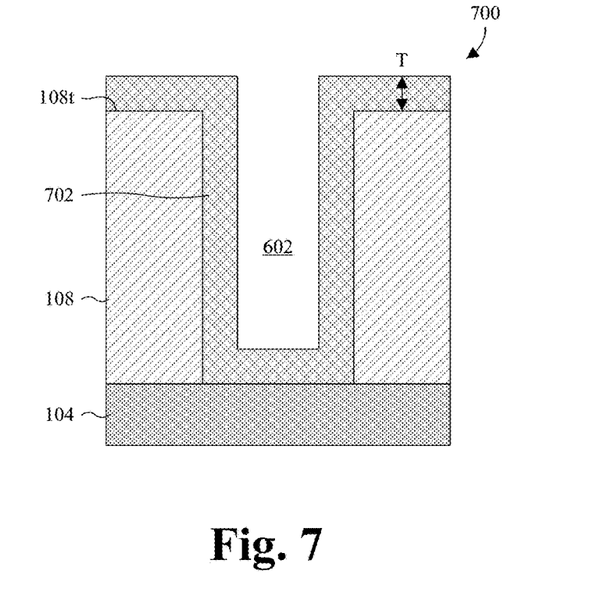

As illustrated by the cross-sectional view 700 of FIG. 7, a sacrificial spacer layer 702 is formed covering the heater dielectric layer 108, and further lining the plug opening 602. In some embodiments, the sacrificial spacer layer 702 is formed conformally and/or is formed with a thickness T that is substantially uniform along its length. Further, in some embodiments, the sacrificial spacer layer 702 is formed of a different material than the heater dielectric layer 108. For example, the heater dielectric layer 108 may be formed of silicon dioxide, and the sacrificial spacer layer 702 may be formed of silicon nitride, or vice versa. Further yet, in some embodiments, the sacrificial spacer layer 702 is formed by atomic layer deposition (ALD), chemical or physical vapor deposition, or some other deposition process.

By forming the sacrificial spacer layer 702 by ALD (e.g., instead of by chemical vapor deposition), the thickness T of the sacrificial spacer layer 702 is uniform or substantially uniform along the length of the sacrificial spacer layer 702, and laterally along a perimeter of the plug opening 602. As seen hereafter, this results in a heating element formed hereafter being insulated from the heater dielectric layer 108, laterally along a perimeter of the heating element, with uniformity or substantial uniformity.

Figure 8:
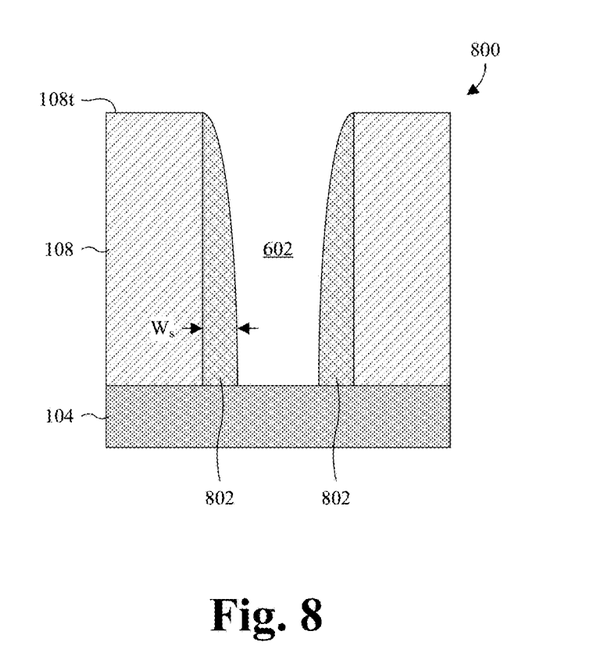

As illustrated by the cross-sectional view 800 of FIG. 8, horizontal segments of the sacrificial spacer layer 702 (see FIG. 7) are removed, without removing vertical segments of the sacrificial spacer layer 702, to define a sacrificial spacer 802 along sidewalls of the plug opening 602. In some embodiments, the horizontal segments of the sacrificial spacer layer 702 are removed, without removing vertical segments of the sacrificial spacer layer 702, by performing an etch into the sacrificial spacer layer 702 until the thickness T (see FIG. 7) of the sacrificial spacer layer 702 has been completely etched through.

In some embodiments, the sacrificial spacer 802 comprises a pair of segments (not individually labeled) respectively on opposite sidewalls of the plug opening 602. Further, in some embodiments, the sacrificial spacer 802 is formed with a square or circular ring-shaped layout, and/or is continuous (outside the cross-sectional view 800) between the segments of the sacrificial spacer 802. Further yet, in some embodiments where the sacrificial spacer layer 702 (see FIG. 7) is formed by ALD, the sacrificial spacer 802 has a uniform or substantially uniform width $W_s$ laterally along a perimeter of the plug opening 602. The perimeter may, for example, be the same as that of the heating plug 112 in FIG. 1B.

Figure 9:
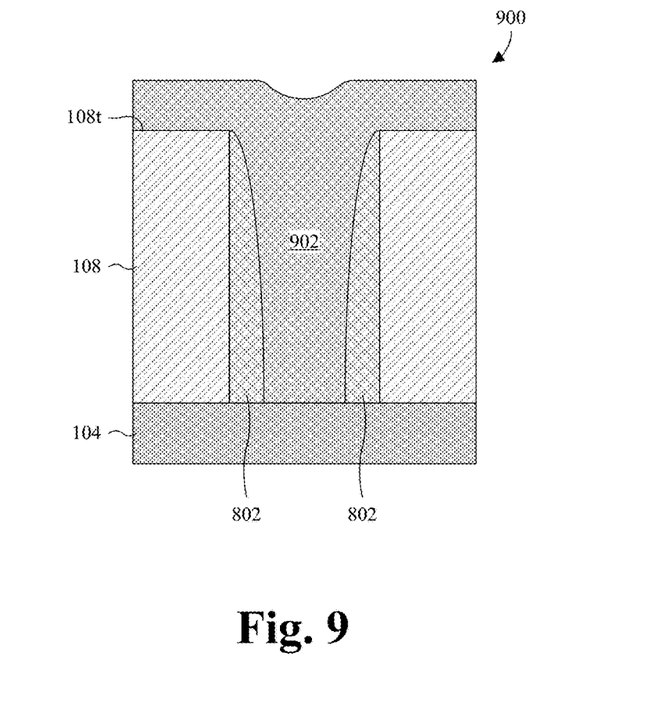

As illustrated by the cross-sectional view 900 of FIG. 9, a heating element layer 902 is formed covering the heater dielectric layer 108 and the sacrificial spacer 802, and further filling the plug opening (see FIG. 8). In some embodiments, the heating element layer 902 is formed of titanium nitride or some other high resistance material. Further, in some embodiments, the heating element layer 902 is formed by chemical vapor deposition, physical vapor deposition, or some other deposition or growth process.

Figure 10:
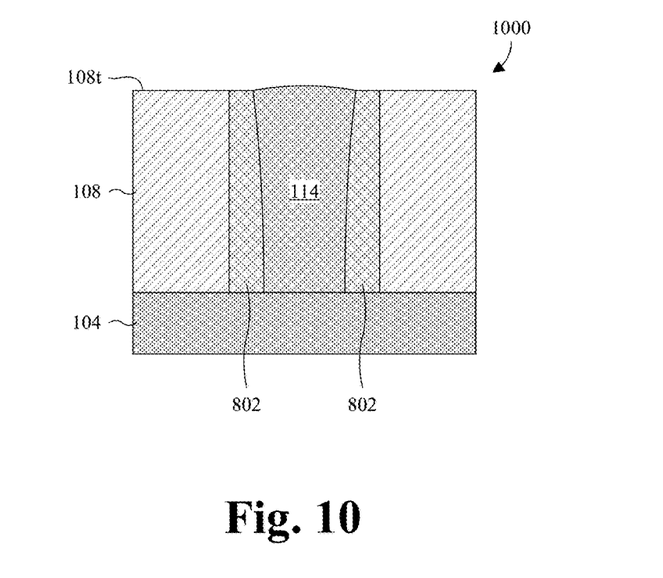

As illustrated by the cross-sectional view 1000 of FIG. 10, a planarization is performed into the heating element layer 902 (see FIG. 9) to form a heating element 114 from the heating element layer 902. Further, the planarization evens out the top surface 108t of the heater dielectric layer 108 with top surfaces respectively of the sacrificial spacer 802 and the heating element 114. In some embodiments, a top surface of the heating element 114 is curved and/or arcs continuously from side to side. Further, in some embodiments, the top surface of the heating element isn't coplanar with the top surfaces respectively of the heater dielectric layer 108 and the sacrificial spacer 802 because of a hardness difference. For example, the heating element 114 may be harder than the sacrificial spacer 802 and/or the heater dielectric layer 108. The planarization may, for example, be performed by a CMP.

Figure 11:
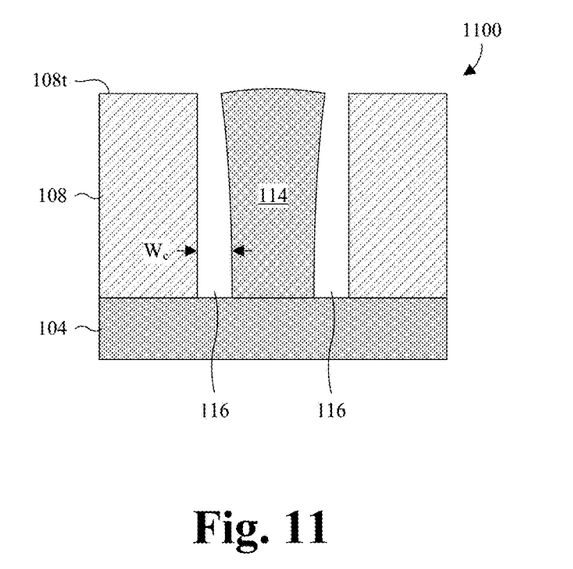

As illustrated by the cross-sectional view 1100 of FIG. 11, the sacrificial spacer 802 (see FIG. 10) is removed to define a cavity 116 in place of the sacrificial spacer 802. In some embodiments, a layout of the cavity 116 is as shown in FIG. 1B. Further, in some embodiments, the cavity 116 has a uniform or substantially uniform width $W_c$ laterally along a perimeter of the heating element 114. This follows because the cavity 116 is formed in place of the sacrificial spacer 802 and, as discussed above, the sacrificial spacer 802 may have a uniform or substantially uniform width $W_s$ (see FIG. 8) laterally along a perimeter of the plug opening 602 (see FIG. 8). The uniform or substantially uniform width $W_c$ of the cavity 116 results in uniform or substantially uniform insulation of the heating element 114 laterally along the perimeter of the heating element 114. An example of the perimeter of the heating element 114 is shown in FIG. 1B.

In some embodiments, the sacrificial spacer 802 is removed by performing an etch into the sacrificial spacer 802. The etch may, for example, be performed by vapor etching or some other etching process. Such vapor etching includes, for example, vapor hydrofluoric acid (VHF) etching or chemical dry etching (CDE). Further, the etch may, for example, be performed using an etchant with a higher etch rate for the sacrificial spacer 802 than etch rates for the heater dielectric layer 108 and the heating element 114. In some embodiments where the sacrificial spacer 802 is oxide (e.g., silicon dioxide) and the heater dielectric layer 108 is nitride (e.g., silicon nitride), VHF etching is used to remove the sacrificial spacer 802 since VHF etching has a high etch rate for oxide and a low etch rate for nitride. In some embodiments where the sacrificial spacer 802 is nitride (e.g., silicon nitride) and the heater dielectric layer 108 is oxide (e.g., silicon dioxide), CDE is used to remove the sacrificial spacer 802 since CDE has a high etch rate for nitride and a low etch rate for oxide.

Figure 12:
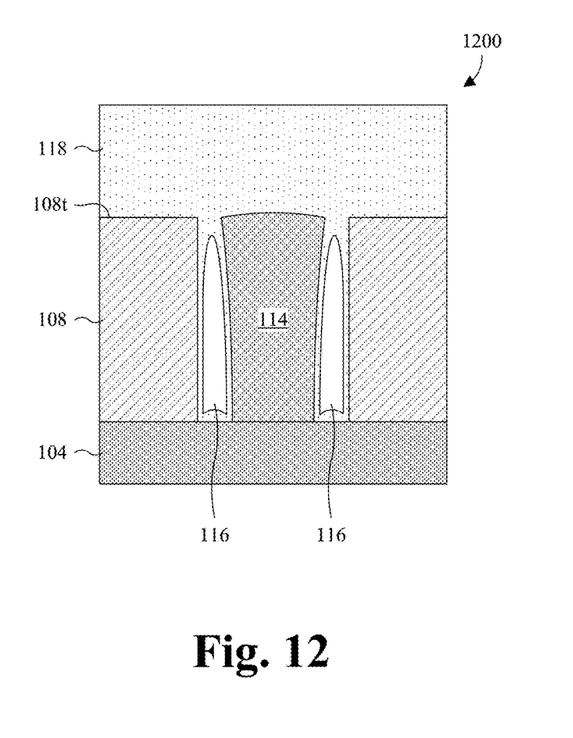

As illustrated by the cross-sectional view 1200 of FIG. 12, a cavity dielectric layer 118 is formed covering the heater dielectric layer 108 and the heating element 114, and further lining and sealing the cavity 116. In some embodiments, the cavity dielectric layer 118 conformally lines the cavity 116 and/or hermetically seals the cavity 116 with a gas therein. Further, in some embodiments, the cavity dielectric layer 118 is formed of silicon dioxide, silicon nitride, or some other dielectric. Further yet, in some embodiments, the cavity dielectric layer 118 is formed by a high-density plasma (HDP) chemical vapor deposition, a plasma-enhanced (PE) chemical vapor deposition, or some other deposition process.

Figure 13:
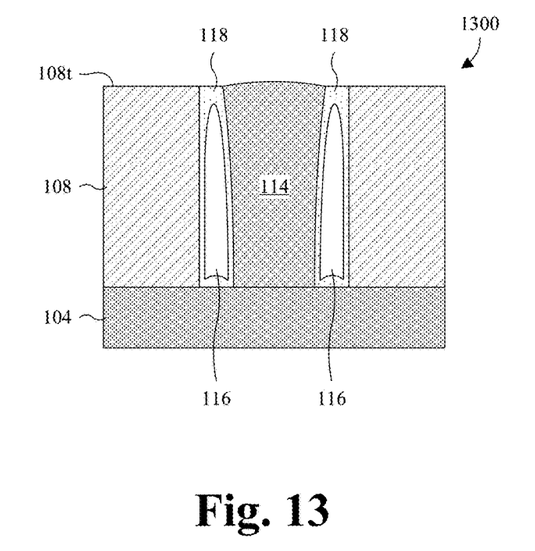

As illustrated by the cross-sectional view 1300 of FIG. 13, a planarization is performed into the cavity dielectric layer 118 to even out a top surface the cavity dielectric layer 118 with a top surface of the heating element 114 and the top surface 108t of the heater dielectric layer 108. In some embodiments, the top surface the cavity dielectric layer 118 is not coplanar with the top surface of the heating element 114 because of a hardness difference. The planarization may, for example, be performed by a CMP.

Figure 14:
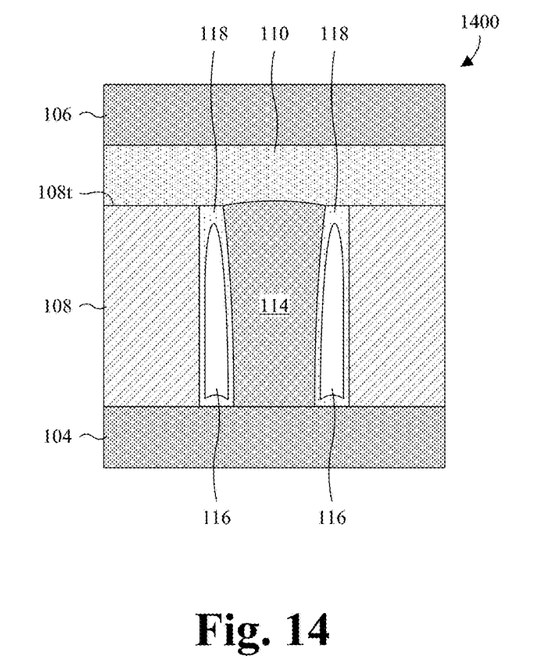

As illustrated by the cross-sectional view 1400 of FIG. 14, a PCE 110 is formed over the heating element 114. In some embodiments, the PCE 110 is formed in direct contact with the heating element 114. Further, in some embodiments, the PCE 110 is formed of GST, GIST, AIST, or some other chalcogenide compound.

In some embodiments, a process for forming the PCE 110 comprises depositing or growing a phase change layer overlying the heating element 114, and subsequently patterning the phase change layer into the PCE 110. The depositing or growing of the phase change layer may, for example, be performed by vapor deposition or some other deposition or growth process. Further, the patterning of the phase change layer may, for example, be performed using photolithography.

Also illustrated by the cross-sectional view 1400 of FIG. 14, a top electrode 106 is formed over the PCE 110. In some embodiments, the top electrode 106 is formed in direct contact with the PCE 110. Further, in some embodiments, the top electrode 106 is formed of tungsten, copper, aluminum copper, or some other conductive material.

In some embodiments, a process for forming the top electrode 106 comprises depositing or growing a top electrode layer over the phase change layer or the PCE 110, and subsequently patterning the top electrode layer into the top electrode 106. The depositing or growing of the top electrode layer may, for example, be performed by vapor deposition, electrochemical plating, or some other deposition or growth process. Further, the patterning of the top electrode layer may, for example, be performed using photolithography.

Figure 15:
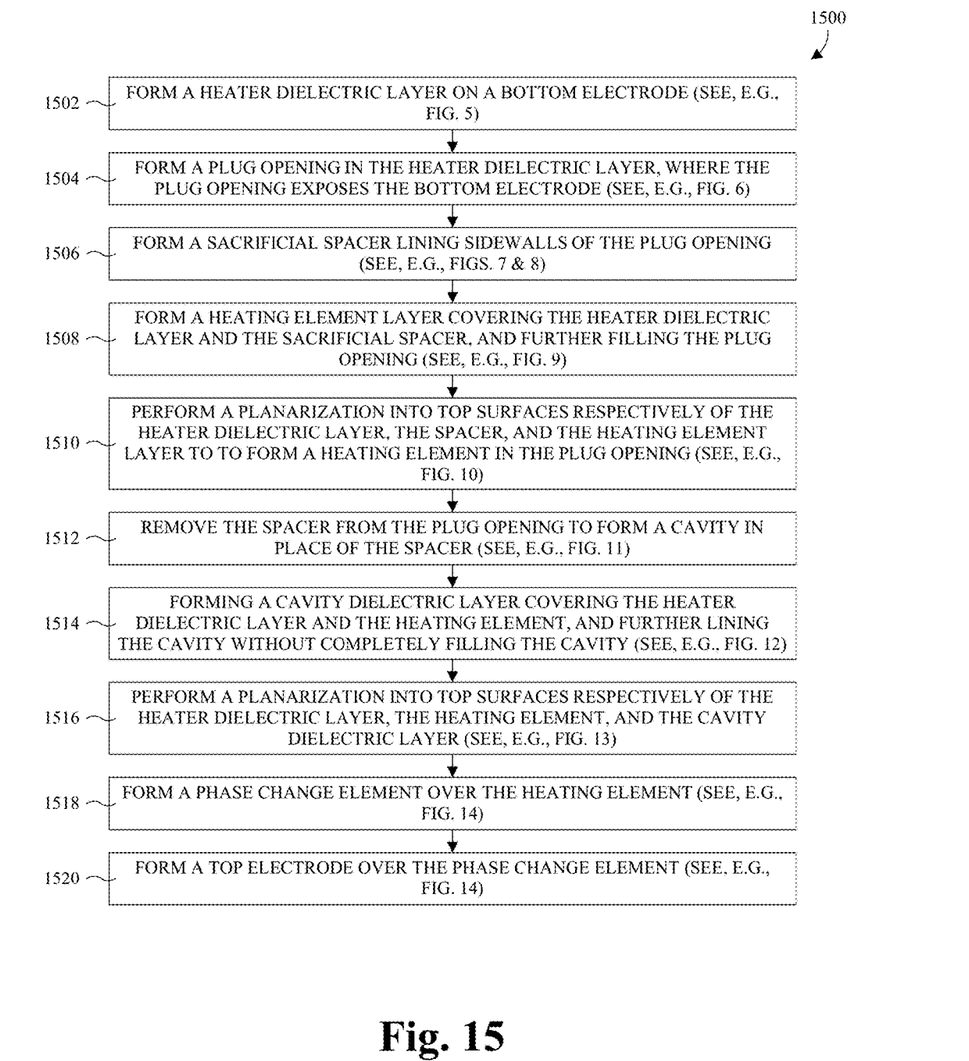
FIG. 15 illustrates a flowchart of some embodiments of the method of FIGS. 5-14.

With reference to FIG. 15, a flowchart 1500 of some embodiments of the method of FIGS. 5-14 is provided.

At 1502, a heater dielectric layer is formed on a bottom electrode. See, for example, FIG. 5.

At 1504, a plug opening is formed in the heater dielectric layer. The plug opening exposes the bottom electrode. See, for example, FIG. 6.

At 1506, a sacrificial spacer is formed lining sidewalls of the plug opening. See, for example, FIGS. 7 and 8. The sacrificial spacer layer may, for example, be formed of oxide or nitride, and/or may, for example, be formed by etching back a sacrificial layer formed by ALD.

At 1508, a heating element layer is formed covering the heater dielectric layer and the sacrificial spacer, and further filling the plug opening. See, for example, FIG. 9.

At 1510, a planarization is performed into top surfaces respectively of the heater dielectric layer, the spacer, and the heating element layer to form a heating element in the plug opening. See, for example, FIG. 10.

At 1512, the spacer is removed from the plug opening to form a cavity in place of the spacer. See, for example, FIG. 11.

At 1514, a cavity dielectric layer is formed covering the heater dielectric layer and the heating element, and further lining the cavity without completely filling the cavity. See, for example, FIG. 12.

At 1516, a planarization is performed into top surfaces respectively of the heater dielectric layer, the heating element, and the cavity dielectric layer. See, for example, FIG. 13.

At 1518, a PCE is formed over the heating element. See, for example, FIG. 14.

At 1520, a top electrode is formed over the PCE. See, for example, FIG. 14.

The cavity thermally isolates the heating element from the heater dielectric layer. As such, a large amount of heat generated by the heating element is applied to the PCE, instead of to the heater dielectric layer, and power consumption is reduced when changing between phases. Further, the cavity electrically isolates the heating element from the heater dielectric layer. As such, charge leaking from the heating element to the heater dielectric layer is low, and efficiency and reliability are improved.

While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, in some embodiments, the present application provides a PCM cell. The PCM cell comprises a bottom electrode, a dielectric layer, a heating element, and a phase change element. The dielectric layer is on the bottom electrode. The heating element extends through the dielectric layer, from a top of the dielectric layer to the bottom electrode. The heating element has a pair of opposite sidewalls laterally spaced from the dielectric layer by a cavity. The phase change element overlies and contacts the heating element. An interface between the phase change element and the heating element extends continuously respectively from and to the opposite sidewalls of the heating element.

In other embodiments, the present application provides a method for manufacturing a PCM cell. An opening is formed in a dielectric layer. The opening comprises a pair of opposite sidewalls defined by the dielectric layer. A spacer is formed in the opening. The spacer comprises a pair of spacer segments respectively lining the opposite sidewalls of the opening. A heating element is formed filling the opening. The heating element is spaced from the opposite sidewalls of the opening by the spacer. A top surface of the heating element extends continuously respectively from and to the spacer segments. The spacer is removed to define a cavity in place of the spacer. A phase change element is formed overlying and contacting the heating element.

In yet other embodiments, the present disclosure provides another method for manufacturing a PCM cell. A dielectric layer is formed covering a bottom electrode. An etch is performed into the dielectric layer to form an opening in a dielectric layer. The opening exposes the bottom electrode. A spacer layer is formed covering the dielectric layer and conformally lining the opening by ALD. An etch back is performed into the spacer layer to form a spacer in the opening. The spacer comprises a pair of spacer segments respectively lining opposite sidewalls of the opening. A heating element is formed filling the opening. The heating element is spaced from the opposite sidewalls of the opening by the spacer. The spacer is removed to define a cavity in place of the spacer. A phase change element is formed overlying and contacting the heating element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change memory (PCM) cell comprising:
   a bottom electrode;
   a dielectric layer on the bottom electrode;
   a heating element extending through the dielectric layer, from a top of the dielectric layer to the bottom electrode, wherein the heating element has a pair of opposite sidewalls laterally spaced from the dielectric layer by a cavity;
   a phase change element overlying and contacting the heating element, wherein an interface between the phase change element and the heating element extends continuously respectively from and to the opposite sidewalls of the heating element; and
   a cavity dielectric layer lining the cavity without completely filling the cavity.

2. The PCM cell according to claim 1, wherein a width of the heating element increases continuously from the bottom electrode to the phase change element.

3. The PCM cell according to claim 1, wherein the opposite sidewalls of the heating element each arc continuously from the bottom electrode to the phase change element.

4. The PCM cell according to claim 1, wherein a two-dimensional (2D) projection of the cavity onto the bottom electrode is ring shaped.

5. The PCM cell according to claim 1, wherein the cavity is hermetically sealed.

6. The PCM cell according to claim 1, wherein the phase change element contacts a top surface of the dielectric layer, and wherein the top surface of the dielectric layer is planar.

7. The PCM cell according to claim 1, wherein the interface between the phase change element and the heating element is curved.

8. A method for manufacturing a phase change memory (PCM) cell, the method comprising:
- forming an opening in a dielectric layer, wherein the opening comprises a pair of opposite sidewalls defined by the dielectric layer;
- forming a spacer in the opening, wherein the spacer comprises a pair of spacer segments respectively lining the opposite sidewalls of the opening;
- forming a heating element filling the opening, wherein the heating element is spaced from the opposite sidewalls of the opening by the spacer, and wherein a top surface of the heating element extends continuously respectively from and to the spacer segments;
- removing the spacer to define a cavity in place of the spacer; and
- forming a phase change element overlying and contacting the heating element.

9. The method according to claim 8, further comprising:
- forming the dielectric layer covering a bottom electrode, wherein the forming of the opening exposes the bottom electrode.

10. The method according to claim 8, wherein the forming of the spacer comprises:
- forming a spacer layer covering the dielectric layer and lining the opening; and
- performing an etch into the spacer layer to remove horizontal segments of the spacer layer without removing vertical segments of the spacer layer, wherein the spacer corresponds to a vertical segment of the spacer layer.

11. The method according to claim 10, wherein the spacer layer is formed by atomic layer deposition (ALD).

12. The method according to claim 8, wherein the spacer is formed with a ring-shaped layout.

13. The method according to claim 8, wherein the spacer is formed with curved sidewalls in the opening, and wherein the heating element is formed with a width decreasing continuously from top to bottom.

14. The method according to claim 8, wherein the forming of the heating element comprises:
- forming a heating element layer covering the dielectric layer and completely filling the opening between the spacer segments; and
- performing a planarization into the heating element, the dielectric layer, and the spacer to even out top surfaces respectively of the heating element, the dielectric layer, and the spacer, wherein a remaining portion of the heating element layer in the opening corresponds to the heating element.

15. The method according to claim 8, wherein the removing comprises performing an etch into the spacer using an etchant that has a higher etch rate for the spacer than etch rates respectively of the dielectric layer and the heating element.

16. The method according to claim 15, wherein the etchant is a vapor.

17. The method according to claim 8, further comprising:
- forming a cavity dielectric layer lining the cavity without complete filling the cavity.

18. A method for manufacturing a phase change memory (PCM) cell, the method comprising:
- forming a dielectric layer covering a bottom electrode;
- performing an etch into the dielectric layer to form an opening in the dielectric layer, wherein the opening exposes the bottom electrode;
- forming a spacer layer covering the dielectric layer and conformally lining the opening by atomic layer deposition (ALD);
- performing an etch back into the spacer layer to form a spacer in the opening, wherein the spacer comprises a pair of spacer segments respectively lining opposite sidewalls of the opening;
- forming a heating element filling the opening, wherein the heating element is spaced from the opposite sidewalls of the opening by the spacer;
- removing the spacer to define a cavity in place of the spacer; and
- forming a phase change element overlying and contacting the heating element.

19. The method according to claim 18, wherein the dielectric layer is a single material, wherein the spacer layer is a single material different than that of the dielectric layer, and wherein the spacer layer is nitride or oxide.

20. The PCM cell according to claim 1, wherein the cavity dielectric layer has a pair of dielectric segments respectively lining the opposite sidewalls of the heating element, and wherein each of the dielectric segments extends along a periphery of the cavity in an individual closed path.

* * * * *